US006380572B1

United States Patent
Pain et al.

(10) Patent No.: US 6,380,572 B1
(45) Date of Patent: Apr. 30, 2002

(54) SILICON-ON-INSULATOR (SOI) ACTIVE PIXEL SENSORS WITH THE PHOTOSITE IMPLEMENTED IN THE SUBSTRATE

(75) Inventors: Bedabrata Pain, Los Angeles; Xinyu Zheng, Monterey Park, both of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/414,975

(22) Filed: Oct. 7, 1999

Related U.S. Application Data

(60) Provisional application No. 60/103,358, filed on Oct. 7, 1998.

(51) Int. Cl.[7] .............................................. H01L 31/062
(52) U.S. Cl. ....................... 257/292; 257/290; 257/350; 348/302; 348/308; 437/74
(58) Field of Search ................................. 257/290, 291, 257/192, 350, 351, 444, 445, 446, 461, 466; 348/302, 308; 437/74

(56) References Cited

U.S. PATENT DOCUMENTS

| | | | | |
|---|---|---|---|---|
| 4,236,831 A | * | 12/1980 | Hendrickson | 257/30 |
| 5,343,064 A | | 8/1994 | Spangler et al. | |
| 5,587,596 A | | 12/1996 | Chi et al. | |
| 5,614,744 A | | 3/1997 | Merrill | |
| 5,739,562 A | | 4/1998 | Ackland et al. | |
| 5,789,774 A | | 8/1998 | Merrill | |
| 5,808,346 A | | 9/1998 | Ueda | |
| 5,847,422 A | * | 12/1998 | Chi et al. | 257/291 |
| 5,869,872 A | * | 2/1999 | Asai et al. | 257/360 |
| 5,877,521 A | | 3/1999 | Johnson et al. | |
| 5,886,659 A | | 3/1999 | Pain et al. | 341/155 |
| 5,900,623 A | * | 5/1999 | Tsang et al. | 250/208.1 |
| 5,909,026 A | | 6/1999 | Zhou et al. | 250/208.1 |
| 5,909,041 A | * | 6/1999 | Hosier et al. | 257/292 |
| 5,929,800 A | | 7/1999 | Zhou et sl. | 341/161 |
| 5,949,483 A | * | 9/1999 | Fossum et al. | 348/303 |
| 6,127,701 A | * | 10/2000 | Disney | 257/338 |

FOREIGN PATENT DOCUMENTS

EP        0809300 A2   *   11/1997

* cited by examiner

*Primary Examiner*—Nathan Flynn
*Assistant Examiner*—Remmon R. Fordé
(74) *Attorney, Agent, or Firm*—Fish & Richardson P.C.

(57) ABSTRACT

Active pixel sensors for a high quality imager are fabricated using a silicon-on-insulator (SOI) process by integrating the photodetectors on the SOI substrate and forming pixel readout transistors on the SOI thin-film. The technique can include forming silicon islands on a buried insulator layer disposed on a silicon substrate and selectively etching away the buried insulator layer over a region of the substrate to define a photodetector area. Dopants of a first conductivity type are implanted to form a signal node in the photodetector area and to form simultaneously drain/source regions for a first transistor in at least a first one of the silicon islands. Dopants of a second conductivity type are implanted to form drain/source regions for a second transistor in at least a second one of the silicon islands. Isolation rings around the photodetector also can be formed when dopants of the second conductivity type are implanted. Interconnections among the transistors and the photodetector are provided to allow signals sensed by the photodetector to be read out via the transistors formed on the silicon islands.

26 Claims, 5 Drawing Sheets

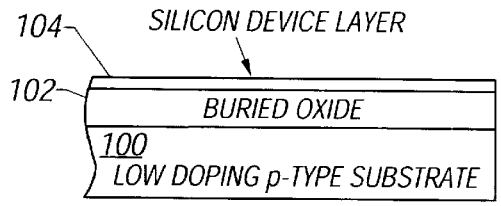
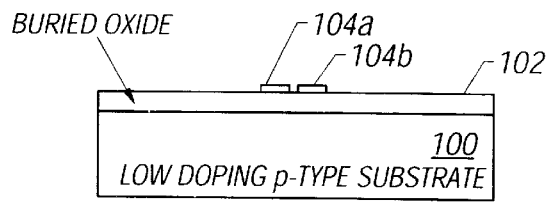
FIG. 6A  FIG. 6B
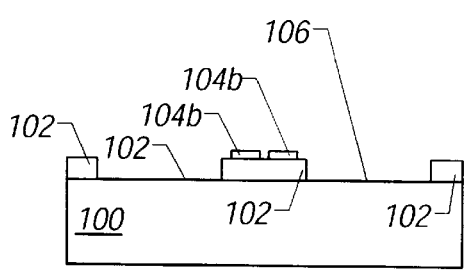
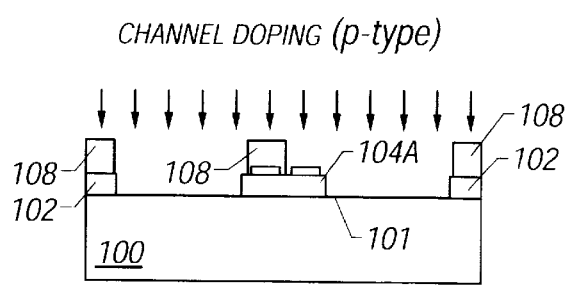
FIG. 6C  FIG. 6D
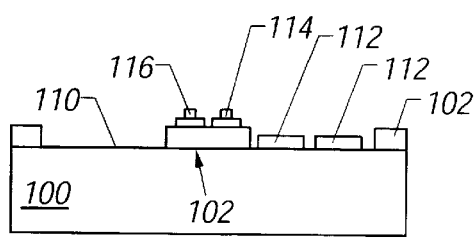
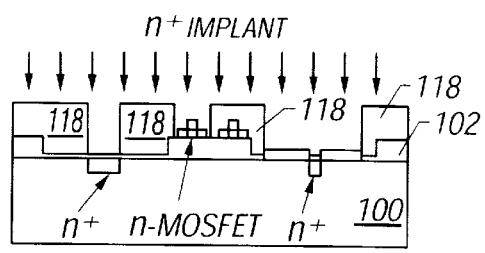
FIG. 6E  FIG. 6F
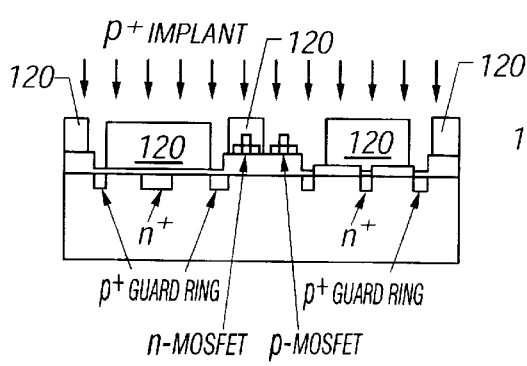
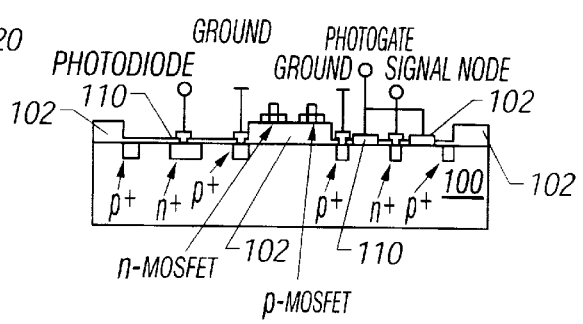
FIG. 6G  FIG. 6H

SILICON-ON-INSULATOR (SOI) ACTIVE PIXEL SENSORS WITH THE PHOTOSITE IMPLEMENTED IN THE SUBSTRATE

CROSS REFERENCE TO RELATED APPLICATION

This application claims the benefit of U.S. Provisional Application No. 60/103,358, filed on Oct. 7, 1998.

STATEMENT AS TO FEDERALLY SPONSORED RESEARCH

The invention described herein was made in the performance of work under a NASA contract, and is subject to the provisions of Public Law 96-517 (35 U.S.C. 202) in which the Contractor has elected to retain title.

BACKGROUND

The present disclosure relates, in general, to image sensors and, in particular, to silicon-on-insulator (SOI) active pixel sensors with the photosites implemented in the substrate.

In general, image sensors find applications in a wide variety of fields, including machine vision, robotics, guidance and navigation, and automotive applications, as well as consumer products. While complementary metal-oxide-semiconductor (CMOS) technology has provided the foundation for advances in low-cost, low-power, reliable, highly integrated systems for many consumer applications, charge coupled devices (CCDs) have been, until recently, the primary technology used in electronic imaging applications. CCDs, however, are high capacitance devices that require high voltage clocks, consume large amounts of energy, and provide only serial output. They require specialized silicon processing that is not compatible with CMOS technology.

More recently, the availability of near or sub-micron CMOS technology and the advent of active pixel sensors (APS) have made CMOS technology more attractive for imaging applications. Active pixel sensors have one or more active transistors within the pixel unit cell and can be made compatible with CMOS technologies.

In the past few years, small pixel sizes, low noise, high speed, and high dynamic range have been achieved in CMOS imagers. In addition, a wide variety of pixel architectures and designs that optimize various aspects of imager performance have been demonstrated using CMOS-based technology.

It is expected that scaling of MOS devices to smaller geometries will continue to yield higher operating speeds and greater packing densities in CMOS-based integrated circuits. While fine geometries are desirable for computers and other circuits, such scaling can adversely affect the performance of imagers. For example, the scaling of MOS devices in imagers requires a continued increase in channel doping, thus leading to significantly reduced depletion widths on the order of less than 0.1 micron ($\mu$m).

As shown in FIG. 1, a photosite is implemented using bulk-CMOS technology. In this context, "bulk-CMOS" technology refers to the fact that the substrate 20 is an integral part of the MOS devices. The photo-collection site is the reverse-biased photodiode 22 formed by the n+/p-substrate junction 24. Photocarriers are stored at the n+/p interface where the potential is highest. Photoelectrons generated within the depletion region 26 are collected at the interface 24 with a high efficiency due to the existence of an electric field. On the other hand, only some of the photo-electrons generated outside the depletion region 26 will diffuse into the collecting area, thereby reducing the collection efficiency and increasing cross-talk.

For photons having a wavelength in the range of 400–800 nanometers (nm), the photon absorption depth varies from about 0.1 to 10 $\mu$m. However, in a typical 0.5 $\mu$m CMOS technology, the depletion widths are less than 0.2 $\mu$m. With the exception of blue light, many photons in the visible spectrum will be absorbed outside the depletion region 26. Therefore, CMOS imagers implemented using a 0.5 $\mu$m technology will exhibit a lower quantum efficiency and increased cross-talk compared to imagers implemented with a coarser process. The increased cross-talk can lead to degraded color performance and smear. In addition to optical cross-talk, imagers made using bulk-CMOS technology also tend to exhibit electrical cross-talk.

Another problem in imagers made using bulk-CMOS technology is a rise in photodiode leakage current when the device is exposed to radiation. The rise in leakage current is caused by the use of Local Oxidation of Silicon (LOCOS) processes to create isolation regions 28 between active circuits. The "bird's beak" 30 feature at the transition between the thin-gate oxide region 32 and the thick field-oxide region creates a high electric field, thereby causing increased trap-generation during exposure to radiation. Although the leakage current can be reduced by using a radiation-hard fabrication process, such processes are relatively expensive and add to the overall cost of the imager.

In contrast to bulk-CMOS technology, SOI-CMOS technologies have recently been developed. In a SOI-CMOS process, a thick silicon substrate is separated from a thin silicon film by a buried oxide. The thin silicon film is patterned to produce the MOS devices. The principal of operation is similar to the operation of bulk-MOS devices, except the transistors do not share a common substrate., The thin-film nature of SOI-MOS devices and the absence of a common substrate can provide several advantages over bulk-MOS devices, including better performance for short channel devices, lower power and higher speed resulting from lower parasitic capacitance, and no latch-up. In addition, SOI-CMOS processes can provide higher device density, less leakage current and radiation hardness.

Nevertheless, the thin silicon film in SOI-MOS devices previously has made them unsuitable for imagers. In particular, the silicon film, with a thickness of only about 0.1–0.3 $\mu$m, is too thin to efficiently absorb visible light with photon depths of about 3–4 $\mu$m.

SUMMARY

In general, active pixel or other optical sensors that can be incorporated, for example, in a high quality imager are fabricated using a silicon-on-insulator (SOI) process by integrating the photodetectors on the SOI substrate and forming pixel readout transistors on the SOI thin-film.

According to one aspect, a method of fabricating an active pixel sensor includes forming a photodetector in a silicon substrate and forming electrical circuit elements in a thin silicon film formed on an insulator layer disposed on the substrate. Interconnections among the electrical circuit elements and the photodetector are provided to allow signals sensed by the photodetector to be read out via the electrical circuit elements formed in the thin silicon film.

In a related aspect, a method of fabricating an active pixel sensor includes forming silicon islands on a buried insulator layer disposed on a silicon substrate and selectively etching away the buried insulator layer over a region of the substrate to define a photodetector area. Dopants of a first conductivity type are implanted to form a signal node in the photodetector area and to form simultaneously drain/source regions for a first transistor in at least a first one of the silicon islands. Dopants of a second conductivity type are implanted to form drain/source regions for a second transistor in at least a second one of the silicon islands. Isolation rings around the photodetector also can be formed when dopants of the second conductivity type are implanted. Interconnections among the transistors and the photodetector are provided to allow signals sensed by the photodetector to be read out via the transistors formed on the silicon islands.

According to another aspect, an active pixel sensor includes a silicon substrate having a photodetector formed therein. An insulator layer is disposed on the silicon substrate. The pixel sensor also includes a readout circuit to read signals from the photodetector. The readout circuit includes electrical circuit elements formed in a thin silicon film disposed on the insulator layer.

One or more of the following features are present in some implementations. The photodetector can be, for example, a photodiode or photogate-type photodetector.

The electrical circuit elements formed in the thin silicon film can include multiple SOI-MOS transistors. The readout circuit may include a reset switch, a buffer switch and a row selection switch. For example, the buffer switch can comprise a source follower input transistor connected in series with the row selection switch so that when the row selection switch is turned on, a signal from the active pixel sensor is transferred to a column bus. In some embodiments, the reset switch includes a p-type MOS transistor.

In other implementations, the readout circuit includes a transistor having a transfer gate and a sense node. Charge collected by the photodetector is transferred to the sense node via a floating diffusion region and through the transfer gate.

The insulator layer can comprise a buried oxide layer having a thickness, for example, of less than about 0.5 microns. The thin silicon film may have a thickness of less than about 0.5 microns, and the substrate can have a dopant concentration in a range of about $10^{11}/cm^3$ to $5\times10^{15}/cm^3$. Other thicknesses and dopant levels may be suitable for particular implementations.

Additionally, a surface area of the photodetector formed in the substrate can be passified with an implant of the same conductivity type as the conductivity of the substrate.

In a further aspect, an imager includes multiple active pixel sensors, circuitry for driving the active pixel sensors, as well as row and column decoders for selecting one or more pixels whose signals are to be read. Each of the pixel sensors can be designed and fabricated as discussed above and as discussed in greater detail below.

Various implementations include one or more of the following advantages. A high quantum efficiency and low noise can be achieved for the pixels. The pixels can exhibit very little cross-talk and can be formed closely to one another. They also can have a large charge handling capacity and, therefore, a large dynamic range. They can be implemented for low power consumption and high speed operation. Additionally, the pixels can exhibit radiation hardness. The foregoing advantages are discussed in greater detail below.

Other features and advantages will be readily apparent from the following description, accompanying drawings and the claims.

BRIEF DESCRIPTION OF THE DRAWINGS

FIGS. 6A through 6H are cross-sections illustrating processing steps for fabricating monolithic SOI active pixel sensors according to the invention.

DETAILED DESCRIPTION

Figure 1:
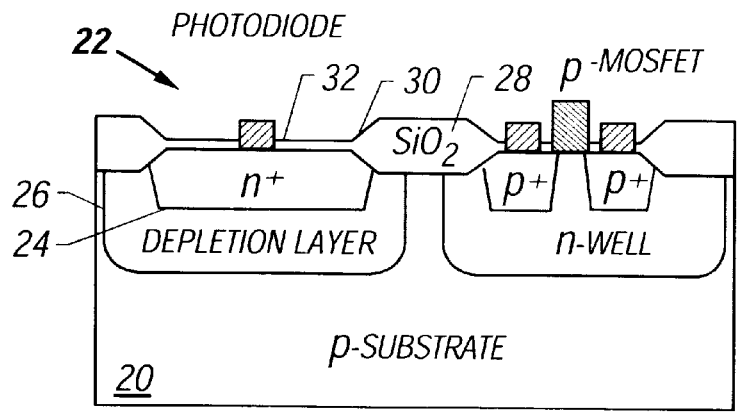
FIG. 1 is a cross-section of a CMOS active pixel sensor.
Figure 2:
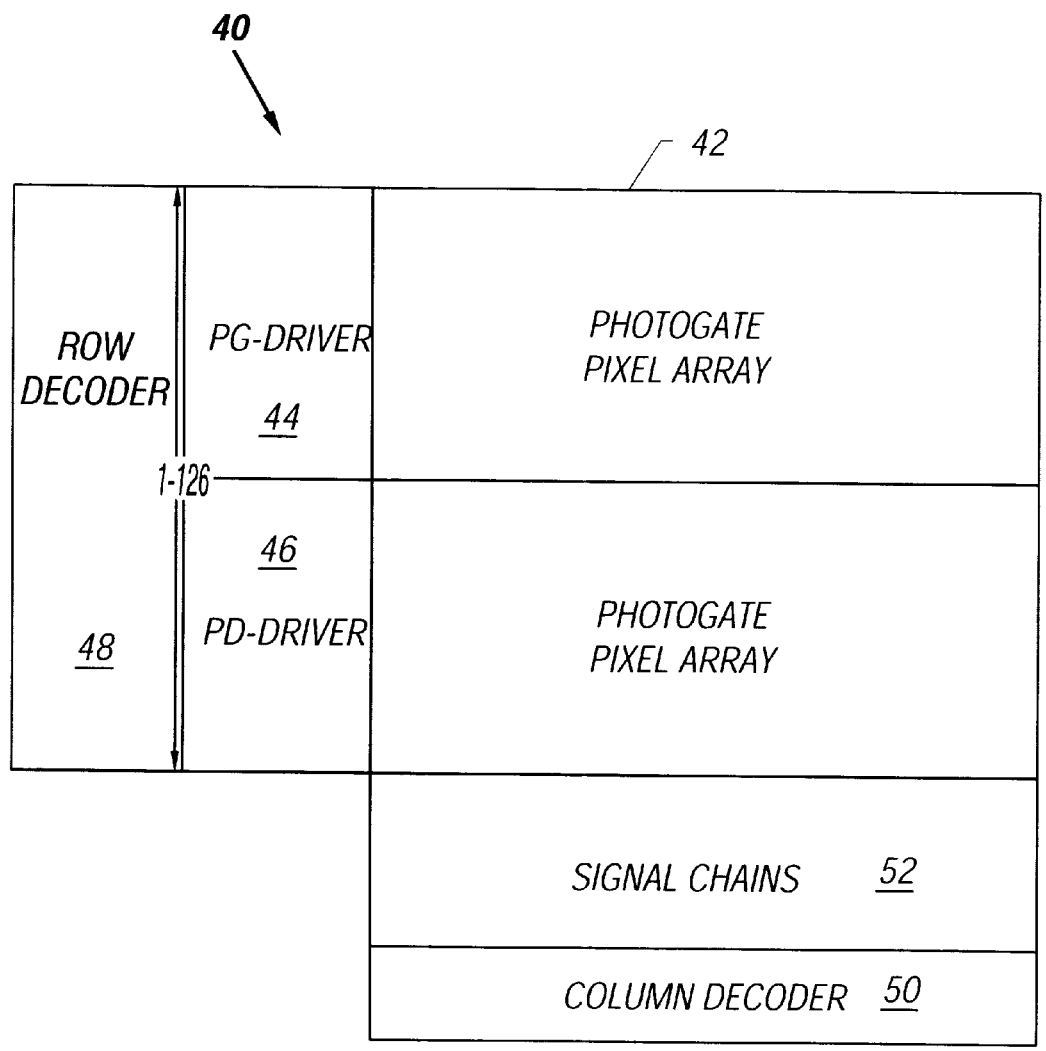
FIG. 2 shows an exemplary layout of an imager according to the invention.

FIG. 2 shows an exemplary active pixel sensor imager 40 formed on an integrated circuit chip that includes an array 42 of active pixel sensors. In one implementation, for example, the imager 40 includes a 144×128 array of pixels. The array 42 can include photogate pixels and/or photodiode pixels. The imager 40 also includes circuitry 44 for driving the photogate pixels and circuitry 46 for driving the photodiode pixels. In addition, the imager 40 has a row decoder 48 for selecting a particular row of pixels and a column decoder 50 for selecting a particular column of pixels, as well as source-follower signal chain circuitry 52. The signal chain circuitry can include, for example, enhancement mode and/ or depletion mode source-followers. An on-chip controller (not shown) controls the operation of the decoders 48, 50, the drivers 44, 46 and the pixels.

In general, the imager 40 can be fabricated using a SOI-CMOS process by integrating the photodetectors on the SOI substrate, instead of in the thin SOI-film. Transistors or other electrical circuit elements for reading out the pixels are formed in the SOI thin-film. Incorporation of the photodetectors on the SOI substrate enables implementation of a high quality monolithic imager using an SOI process because the optical response is no longer governed by the SOI thin-film properties. Substrate doping can be chosen independently of the channel doping because the substrate is not used for active devices. The technique also allows for independent optimization of amplifier and imager performance.

Figure 3:
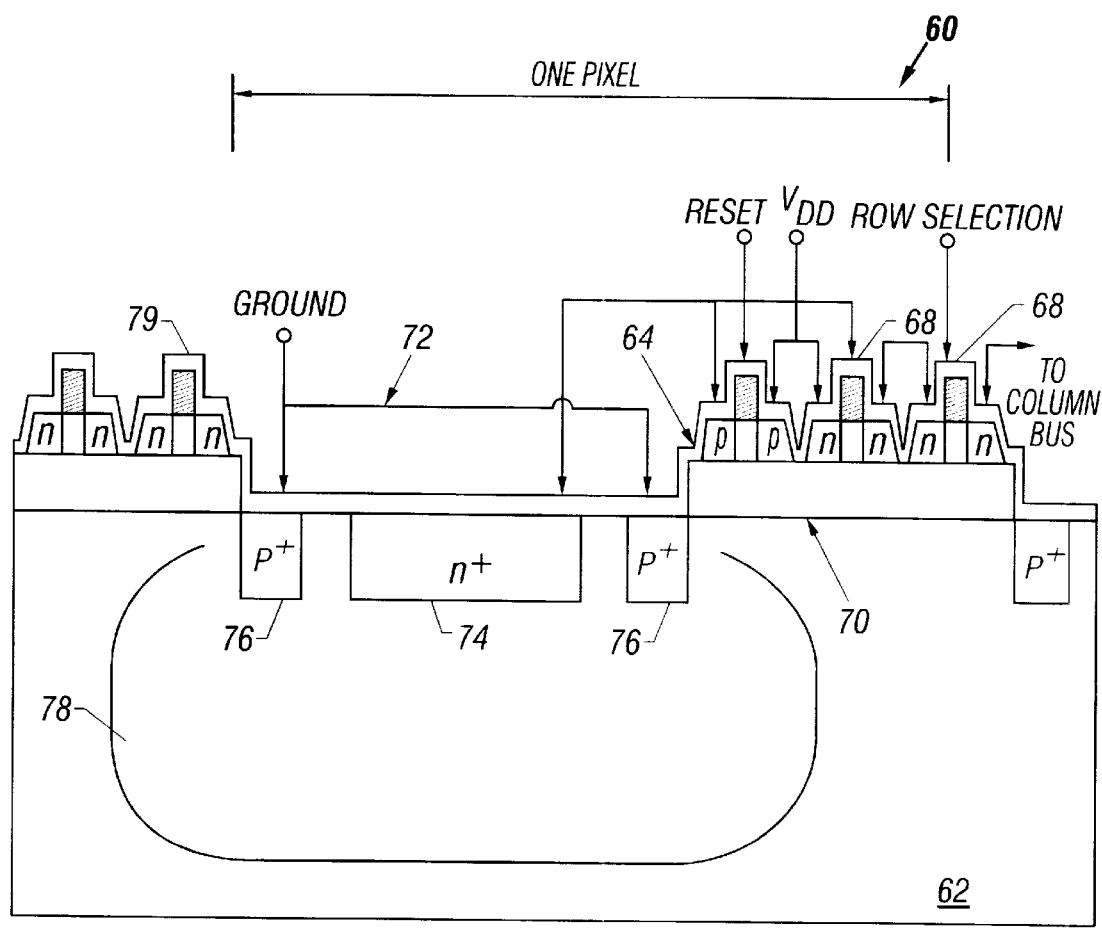
FIG. 3 illustrates a monolithic pixel architecture for a photodiode-type imager according to the invention.

FIG. 3 illustrates a monolithic pixel architecture for a photodiode-type imager. The pixel 60 includes a low-doped, high resistivity p-type silicon substrate 62, and SOI transistors 64, 66, 68 separated from the substrate by an insulator layer such as a buried oxide layer 70. The buried oxide layer 70 can be formed, for example, of silicon dioxide ($SiO_2$). The buried oxide 70 is selectively etched away in the photodetector area 72, where an n+ implantation 74 is used to define the photodetector. The photodetector 72 is surrounded by p+ implantation regions 76 to provide pixel-to-pixel isolation. The isolation regions 76 can be formed as either junction guard rings or as trench guard rings. An optional p-doping can be provided to passify the surface of the photodetector area and thereby reduce the dark current.

The thick silicon substrate 62 can provide a deep depleted region 78 for photo-current collection. For example, a p-type dopant concentration of less than about $10^{13}/cm^3$ can be used for the substrate 62 to provide a depletion width of approximately five microns. The high resistivity substrate can help ensure a high quantum efficiency through the increase in depletion width, thereby resulting in efficient optical collection.

Figure 4:
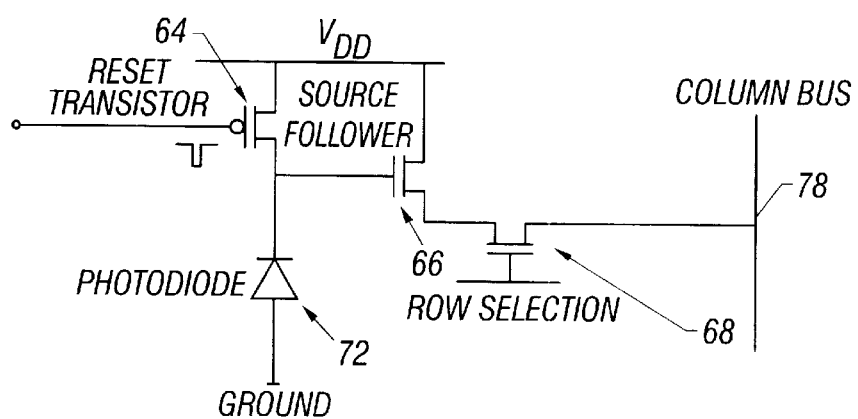
FIG. 4 shows a schematic for the pixel illustrated in FIG. 3.

In addition to the photodetector 72, the pixel 60 includes three SOI transistors 64, 66, 68 for resetting, buffering and selecting the pixel, respectively. The pixel schematic for the photodiode-type pixel 60 is shown in FIG. 4. The source follower input transistor 66 is connected in series with the row selection transistor 68 so that when the row selection transistor is turned on, the pixel signal is transferred to a column bus 78. The reset transistor 64 can be implemented, for example, as a p-type field transistor (FET) to provide higher charge handling capacity and, thus, a high dynamic range. The reset gate 64 can allow the pixel to be reset to the power supply voltage VDD without resulting in the occurrence of latch-up.

By forming the transistors 64, 66, 68 using SOI technology, cross-talk can be reduced because of the low parasitic capacitance, and individual transistors can be formed on MESA-isolation regions separated by a low-k dielectric layer 79, such as silicon dioxide.

Figure 5:
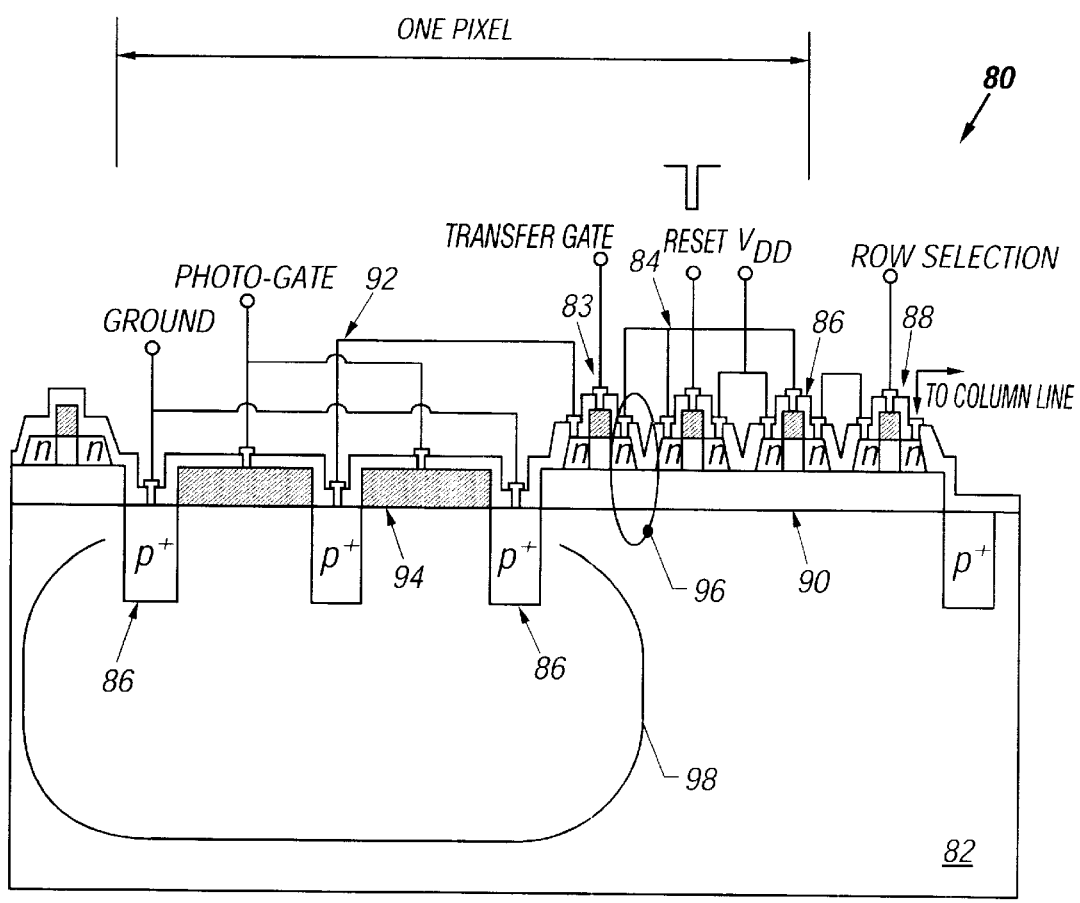
FIG. 5 illustrates a monolithic pixel architecture for a photogate-type imager according to the invention.

A low-noise photogate-type device 80 (FIG. 5) also can be fabricated in a similar manner. The pixel 80 includes a low-doped p-type silicon substrate 82, and SOI transistors 83, 84, 86, 88, separated from the substrate by an insulator layer such as a buried oxide layer 90. The buried oxide 90 is selectively etched away in the photodetector area 82, where polysilicon gates 94 are used to define the photodetector. As in the photodiode pixel 60 of FIG. 3, the detector 92 in the photogate pixel 80 can be surrounded by p+ implantation regions 97 to provide pixel-to-pixel isolation, and an optional p-doping can be provided to passify the surface of the photodetector area and thereby reduce the dark current. The isolation regions 97 can be formed as either junction guard rings or as trench guard rings. The thick silicon substrate 82 can provide a deep depleted region 98 for photo-current collection.

The photogate pixel 80 includes a reset transistor 84, a buffer transistor 86, and a row selection transistor 88, as well as an additional transistor 83 having a transfer gate. Charges collected under the polysilicon gates 94 are transferred to a sense node 96 via a floating n+ diffusion region and through the transfer gate. The sense node 96, where charge is converted to voltage, includes a floating n+ diffusion in the thin-film above the oxide layer 90 and is separated from the photo-collection area 98. Separation of the sense node 96 from the photo-collection area 98 permits an implementation with in-pixel correlated double sampling readout, and leads to very low noise. In contrast to a photogate APS implemented with a bulk-CMOS process, the capacitance of the sense node 96 can be reduced, thereby leading to even lower noise.

Detailed processing steps for the fabrication of monolithic SOI active pixel sensors are illustrated in FIGS. 6A through 6H. The process is compatible with conventional SOI microfabrication, self-aligned processes and requires only one additional photolithographic mask for detector definition. No additional high temperature processing steps are needed. Of course, in particular implementations, additional masks, fabrication steps, and/or high temperature processes may be used as well.

As shown in FIG. 6A, a buried oxide layer 102 is provided on a low-doped p-type silicon substrate 100, and a thin silicon device layer 104 is formed on the buried oxide layer. The buried oxide layer 102 typically has a thickness less than about 0.5 $\mu$m, for example, in the range of about 0.1–0.2 $\mu$m, and the thin silicon layer 104 typically has a thickness less than about 0.5 $\mu$m, for example, in a range of about 0.1–0.3 $\mu$m. Silicon islands 104A, 104B are formed in areas where SOI transistors are to be provided, as shown in FIG. 6B. A photolithographic mask is used to define windows 106 for photo-collection areas, and the buried oxide 102 is selectively etched away for subsequent implantation as shown in FIG. 6C.

An optional p-type doping implant can be performed, as indicated in FIG. 6D, to control the potential profile near the surface 101 of the substrate 100 in areas where the windows 106 were previously opened. A photolithographic mask 108 can be provided during the optional p-type implant and should be patterned to prevent p-type doping in silicon islands 104A where n-type transistors will be formed. By adding extra p-type dopants, the surface potential can be kept at ground causing hole accumulation at the surface 101. The hole accumulation at the surface quenches the interface traps, leading to low surface generation rates and, therefore, allowing device operation with low dark currents.

As shown in FIG. 6E, gate oxides 110 are formed in the regions defined by the window openings 106. Polysilicon gates 112, 114, 116 are formed at the locations for the photogate and the n and p-type MOSFETs, respectively.

A photolithographic mask 118 is provided for a subsequent n+ implant as shown in FIG. 6F. A single n+ implant can be used to form signal nodes of the photodetectors (photodiode or photogate) and the drain/source regions of the SOI n-type MOSFETs simultaneously.

Another photolithographic mask 120 is provided for a p+ implant as shown in FIG. 6G. A single p+ implant can be used to form the drain/source regions of the SOI p-type MOSFETs and the photodetector guard rings simultaneously.

By forming the detectors (photogate and/or photodiode) and the SOI transistors at the same time, the need for additional high temperature steps can be eliminated. The final structure, with contacts, vias and metallization is shown in FIG. 6H. The difference in heights between the photodiode detector and the SOI transistors is on the order of thickness of the buried oxide layer 102 (i.e., approximately 0.2 $\mu$m) and is sufficiently small to prevent problems in metal step-coverage for the interconnections between the detector and readout circuits. Modulation of the SOI-MOSFET threshold voltage can be mitigated by using a body tie for the transistors.

Compared to a conventional CMOS process, the photolithographic mask used during etching of the buried oxide layer 102 to provide the window areas 106 for the photodetectors represents an additional masking step required in the foregoing process. The p-type implant illustrated in FIG. 6D is an additional step, but is optional and can be omitted.

The foregoing technique permits fabrication of a CMOS imager using an SOI process and also can overcome some of the problems encountered with respect to CMOS imagers implemented using a bulk-CMOS process. The present technique allows substrate doping to be independently chosen without affecting the MOSFET performance. By keeping the substrate doping low, for example, on the order of about $10^{14}/cm^3$ or less, the depletion width of the photodetectors (78 in FIG. 3; 98 in FIG. 5) can be made larger than the photon absorption depth, so that a high quantum efficiency is achieved.

In particular, photodetectors fabricated using the foregoing techniques can exhibit large collection efficiency and high absorption efficiency, both of which are required for high quantum efficiency. Absorption efficiency refers to the fraction of the photons absorbed in the silicon. By forming the photodetector in the relatively thick substrate, the depletion width can be greater than the absorption depth at visible wavelengths. Collection efficiency refers to the fraction of the photo-generated carriers collected at the photosite. Using the techniques described above, the photoelectrons are placed in a converging drift field that enables them to be efficiently collected at the surface. Furthermore, the presence of a vertical drift field renders lateral diffusion insignificant, causing low cross-talk, low smear, and a high modulation transfer function (MTF).

The resultant pixel structure is highly planar. In contrast to bulk-CMOS technologies, the technique described above does not require LOCOS isolation. Furthermore, planarization of the pixel structure in conjunction with the use of thin-film SOI transistors for pixel readout can provide high radiation tolerance. Planarization can be particularly important in preventing a catastrophic rise in dark current caused by field-enhanced trapping and de-trapping of electrons at the interface. Furthermore, the pixel structure is inherently free from latch-up under radiation because the transistors are isolated from one another.

Increased integration and high operating speeds also can result from use of the SOI process by preventing the coupling of noise into sensitive nodes through the substrate. Therefore, high frequency digital circuits and radio frequency circuits can be located near the imager without the digital noise contaminating the charges stored in the photosite. That feature is made possible by forming the readout transistors on the buried oxide layer. The elimination or reduction of substrate noise coupling can result in increased packing density as well as high speed.

Use of the SOI technology also allows the realization of a high-speed pipelined system architecture. Thus, the techniques disclosed above can enable a high speed, high density system-on-a-chip.

Additionally, in contrast to bulk-CMOS processes, the SOI architecture allows incorporation of complimentary transistors in the pixel without fill-factor degradation. By using a p-FET pixel reset transistor, the voltage swing on the sense node can be more than doubled compared to the voltage swing obtained in a bulk-CMOS implementation. An increased voltage swing translates to a correspondingly larger charge handling capacity.

Figure 7:
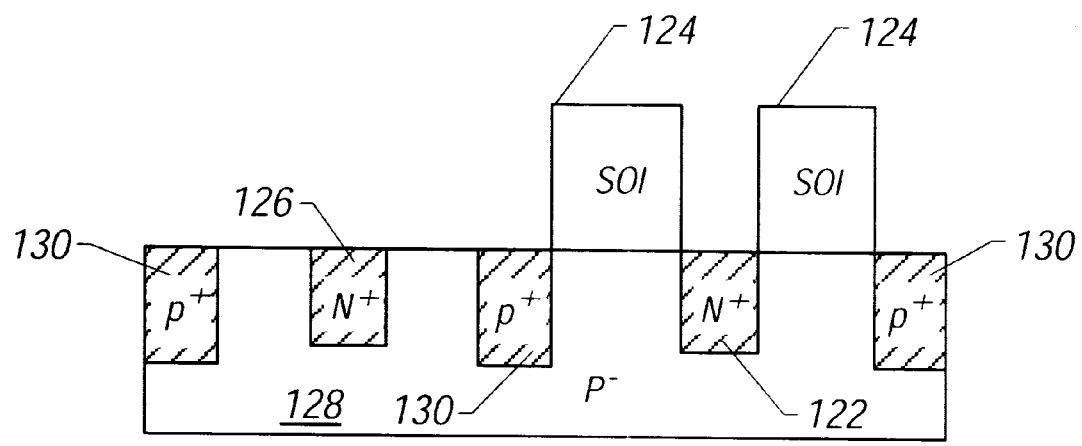
FIG. 7 illustrates a cross-section of a sensor including a dark current sink according to the invention.

The amount of dark current generated at the interface of the substrate and the buried oxide may vary depending on the quality of the SOI wafers. To reduce the dark current, a dark current sink can be provided as shown in FIG. 7. An N+ region 126 defines the photodetector formed in the p-type substrate 128. As discussed above, P+ implanted areas 130 form isolation regions. The dark current sink can be formed by providing an n+ region 122 in the substrate 128 in the vicinity of the SOI regions 124 in which the photodetector readout circuits can be formed. The N+ region 122 forms a reverse-biased p-n junction which can sweep out dark current generated in the SOI regions 124. A dark current sink can be associated with one or more active pixel sensors.

Other implementations are within the scope of the following claims.

What is claimed is:

1. An active pixel sensor comprising:
a silicon substrate having a photodetector formed therein;
an insulator layer disposed on the silicon substrate;
a thin silicon film disposed on the insulator layer, wherein the thin silicon film has a thickness less than about 0.5 microns; and
a readout circuit to read signals from the photodetector, wherein the readout circuit includes electrical circuit elements formed in the thin silicon film.

2. The active pixel sensor of claim 1 wherein the readout circuit includes a plurality of SOI-MOS transistors.

3. The active pixel sensor of claim 1 wherein the photodetector is a photodiode-type photodetector.

4. The active pixel sensor of claim 3 wherein the readout circuit includes a reset switch, a buffer switch and a row selection switch formed in the thin silicon film.

5. The active pixel sensor of claim 4 wherein the buffer switch comprises a source follower input transistor connected in series with the row selection switch so that when the row selection switch is turned on, a signal from the sensor is transferred to a column bus.

6. The active pixel sensor of claim 5 wherein the reset switch includes a p-type MOS transistor.

7. The active pixel sensor of claim 1 wherein the photodetector is a photogate-type photodetector.

8. The active pixel sensor of claim 7 wherein the readout circuit includes a transistor having a transfer gate and a sense node formed on the insulator layer, wherein charge collected by the photodetector is transferred to the sense node via a floating diffusion region and through the transfer gate.

9. The active pixel sensor of claim 8 wherein the readout circuit further includes a reset switch, a buffer switch and a row selection switch formed in the thin silicon film.

10. The active pixel sensor of claim 9 wherein the reset switch includes a p-type MOS transistor.

11. The active pixel sensor of claim 1 wherein the insulator layer comprises an oxide layer.

12. The active pixel sensor of claim 11 wherein the oxide layer has a thickness of less than about 0.5 microns.

13. The active pixel sensor of claim 11 wherein the thin silicon film has a thickness in a range of about 0.1–0.3 microns.

14. The active pixel sensor of claim 11 wherein the substrate has a p-type dopant concentration in a range of about $10^{11}/cm^3$ to $5 \times 10^{15}/cm^3$.

15. The active pixel sensor of claim 1 comprising a p-type substrate, wherein a surface area of the photodetector is passified with a p-type implant.

16. An imager comprising:
a plurality of active pixel sensors;
circuitry for driving the active pixel sensors; and
row and column decoders for selecting one or more pixels whose signals are to be read,
wherein each active pixel sensor includes:
a photodetector formed in a silicon substrate;
an insulator layer disposed on the silicon substrate;
a thin silicon film disposed on the insulator layer, wherein the thin silicon film has a thickness of less than about 0.5 microns; and
a readout circuit to read signals from the photodetector, wherein the readout circuit includes electrical circuit elements formed in the thin silicon film.

17. The imager of claim 16 wherein each readout circuit includes a plurality of SOI-MOS transistors.

18. The imager of claim 16 wherein the photodetector in at least some of the active pixel sensors is a photodiode-type photodetector.

19. The imager of claim 18 wherein the readout circuit associated with each photodetector includes a reset switch, a buffer switch and a row selection switch formed in the thin silicon film.

20. The imager of claim 19 wherein each buffer switch comprises a source follower input transistor connected in series with an associated row selection switch so that when the row selection switch is turned on, a signal from an associated active pixel sensor is transferred to a column bus.

21. The imager of claim 16 wherein the photodetector in at least some of the active pixel sensors is a photogate-type photodetector.

22. The imager of claim 21 wherein the readout circuit associated with each photogate-type photodetector includes a transistor having a transfer gate and a sense node formed on the insulator layer, wherein charge collected by the photodetector is transferred to the sense node via a floating diffusion region and through the transfer gate.

23. The imager of claim 22 wherein the readout circuit associated with each active pixel sensor further includes a reset switch, a buffer switch and a row selection switch formed in the thin silicon film.

24. The imager of claim 16 wherein the photodetectors are formed on a p-type substrate having a dopant concentration in a range of about $10^{11}/cm^3$ to $5\times10^{15}/cm^3$, wherein the insulator layer for each active pixel sensor comprises an oxide layer having a thickness of less than about 0.5 microns, and wherein the thin silicon film for each active pixel sensor has a thickness in a range of about 0.1–0.3 microns.

25. The imager of claim 16 wherein each photodetector is surrounded by a heavily-doped isolation region formed in the substrate.

26. The imager of claim 16 wherein a dark current sink is provided in a vicinity of the readout circuit of each active pixel sensor.

* * * * *